United States Patent
Muona

(10) Patent No.: US 9,778,009 B2
(45) Date of Patent: *Oct. 3, 2017

(54) METHOD AND ARRANGEMENT FOR PREPARING A CHARGING PLAN

(75) Inventor: Jouko Muona, Tampere (FI)

(73) Assignee: SANDVIK MINING AND CONSTRUCTION OY, Tampere (FI)

( * ) Notice: Subject to any disclaimer, the term of this patent is extended or adjusted under 35 U.S.C. 154(b) by 837 days.

This patent is subject to a terminal disclaimer.

(21) Appl. No.: 14/126,022

(22) PCT Filed: Jun. 14, 2012

(86) PCT No.: PCT/FI2012/050606
§ 371 (c)(1),
(2), (4) Date: Dec. 18, 2013

(87) PCT Pub. No.: WO2012/172181
PCT Pub. Date: Dec. 20, 2012

(65) Prior Publication Data
US 2014/0137759 A1    May 22, 2014

(30) Foreign Application Priority Data
Jun. 14, 2011    (FI) .................................... 20115587

(51) Int. Cl.
*G06F 17/50*    (2006.01)
*F42D 3/04*    (2006.01)
(Continued)

(52) U.S. Cl.
CPC ............... *F42D 3/04* (2013.01); *E21B 7/022* (2013.01); *E21B 7/025* (2013.01); *E21C 37/16* (2013.01); *F42D 3/00* (2013.01); *G06F 17/5009* (2013.01)

(58) Field of Classification Search
USPC .......................................... 703/2, 7; 173/11
See application file for complete search history.

(56) References Cited

U.S. PATENT DOCUMENTS 3,721,471 A * 3/1973 Bergmann ................ F42D 3/04
102/313
4,979,575 A    12/1990 Strom et al.
(Continued)

FOREIGN PATENT DOCUMENTS

CN    101512102 A    8/2009
CN    101663463 A    3/2010
(Continued)

OTHER PUBLICATIONS

Sandvik Mining and Construction, "iSURE, a revolution in precision", Julkaisuaika Dec. 30, 2010, Haettu internetosoitteesta.
(Continued)

*Primary Examiner* — Thai Phan
(74) *Attorney, Agent, or Firm* — Corinne R. Gorski

(57) ABSTRACT

A method for preparing a charging plan for rock cavern excavation, in which plan drill hole locations for a round to be drilled in a tunnel face are determined in a predetermined coordinate system by using a drilling plan created by means of a computer-assisted design program. The method determines pull-out of a round on the basis of the locations of the hole ends and the topography of the rock remaining after a round blast, and designs or modifies a charging plan for a subsequent round on the basis of the thus determined pull-out.

20 Claims, 3 Drawing Sheets

(51) Int. Cl.
*E21C 37/16* (2006.01)
*E21B 7/02* (2006.01)
*F42D 3/00* (2006.01)

(56) References Cited

U.S. PATENT DOCUMENTS

| | | | |
|---|---|---|---|
| 6,293,355 B1 | 9/2001 | Koivunen et al. | |
| 6,957,707 B2 * | 10/2005 | Koivunen | E21B 7/022 173/11 |
| 7,707,939 B2 * | 5/2010 | Brent | F42D 3/04 102/312 |
| 9,194,224 B2 * | 11/2015 | Muona | E21D 9/006 |
| 9,389,055 B2 * | 7/2016 | Brent | F42D 3/04 |
| 2002/0036102 A1 | 3/2002 | Ahtola et al. | |
| 2004/0216922 A1 * | 11/2004 | Koivunen | E21B 7/022 175/24 |
| 2008/0245254 A1 * | 10/2008 | Brent | F42D 1/00 102/313 |
| 2010/0044107 A1 | 2/2010 | Keskinen | |
| 2010/0286965 A1 | 11/2010 | Saleniemi et al. | |
| 2011/0100711 A1 | 5/2011 | Puura et al. | |
| 2013/0152812 A1 * | 6/2013 | Brent | F42D 1/055 102/312 |
| 2014/0139007 A1 * | 5/2014 | Muona | E21D 9/006 299/1.8 |

FOREIGN PATENT DOCUMENTS

| | | |
|---|---|---|
| CN | 101802346 A | 8/2010 |
| CN | 101910546 A | 12/2010 |
| EP | 0760419 A2 | 3/1997 |
| JP | 2002188389 A | 7/2002 |
| JP | 2005220627 A | 8/2005 |
| WO | 2003025341 A1 | 3/2003 |
| WO | 2008078001 A1 | 7/2008 |
| WO | 2008078002 A1 | 7/2008 |
| WO | 2008125735 A1 | 10/2008 |
| WO | 2009037381 A1 | 3/2009 |

OTHER PUBLICATIONS

Sandvik Mining and Construction, "iSURE" [online-tiedote]. Julkaisuaika Dec. 30, 2010 Haettu internetista.

* cited by examiner

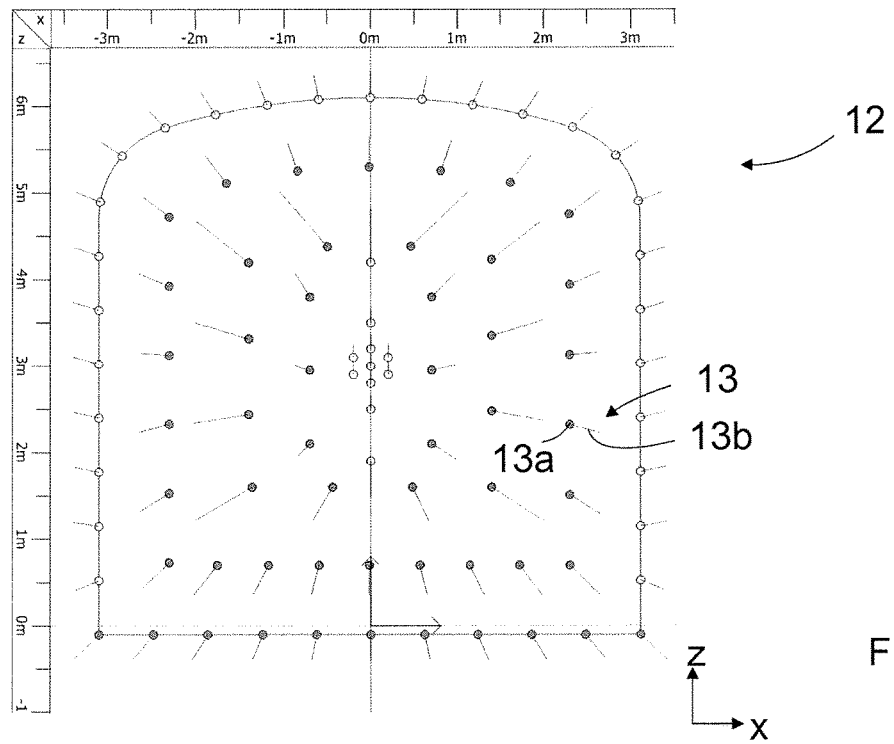
FIG. 2
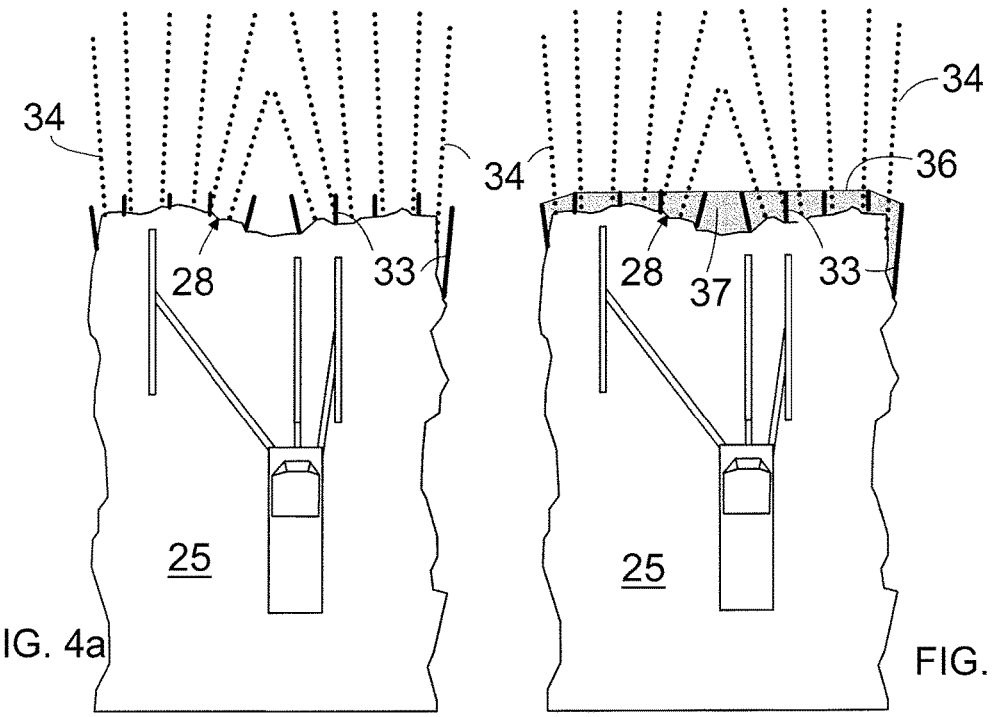
FIG. 4a
FIG. 4b

METHOD AND ARRANGEMENT FOR PREPARING A CHARGING PLAN

RELATED APPLICATION DATA

This application is a §371 National Stage Application of PCT International Application No. PCT/FI2012/050606 filed Jun. 14, 2012 claiming priority of FI Application No. 20115587, filed Jun. 11, 2011.

BACKGROUND OF THE INVENTION

The invention relates to a method for preparing a charging plan for excavation of a rock cavern, the method comprising determining in advance at least drill hole locations in a pre-determined coordinate system for a round to be drilled into the rock cavern and creating a charging plan for the holes in the round by means of a computer-aided design program for blasting the round.

The invention further relates to an arrangement for designing a charging plan for excavating a rock cavern with a rock drilling apparatus comprising one or more drilling booms having a rock drilling unit attached to it and a control unit for controlling the drilling comprising a computer, whereby at least locations of drill holes in a predetermined coordinate system has been defined in advance for a round to be drilled which arrangement comprises a computer with the computer assisted design program for designing the charging plan.

Tunnels, underground storage silos and other rock caverns are excavated in rounds. In a tunnel or other part of a rock cavern, drill holes are drilled, and then charged and blasted after the drilling. One blast detaches from the rock an amount of rock material that equals that of one round. For excavating a rock cavern, a plan is made in advance and information about the rock type, for example, is determined. In general, the orderer of the rock cavern also sets various quality requirements for the cavern to be excavated.

When tunnel drilling is performed by a rock drilling apparatus provided with instrumentation, there is generally designed, as office work, a drilling plan for drilling a round and a charging plan for blasting the round. The drilling plan and the charging plan are supplied to the rock drilling apparatus for being used by means of its control computer. The drilling plan serves as a controlled instruction for drilling drill holes in the rock in such a manner that a desired round can be formed.

The successfulness of drilling and charging is measured, inter alia, by pull-out per round, which refers to the ratio of advance of the tunnel after a blast to a designed length in the drilling plan. Improvement of pull-out from 88 to 95 percent, for instance, means significant cost savings in an excavation project. In practice, defining an optimal pull-out is aimed at by changing the drilling plan or the charging plan. Examples of parameters applied in changing the charging plan include distances between the drill holes, specific charge, charging degree, blast cut in different areas of the plan.

For designing a charging plan there are developed design programs that assist the designer in composing the charging plan. Designing a charging plan is thus an interactive action between the designer and the design program.

Production of drilling plans and continuous design, as well as review of plans during tunnel work, have been developed in various ways in view of blasting techniques, for instance. This is presented in publication WO 2008/078001, for instance.

In practice, in round blasting it has been found that even though the hole locations and the size and amount of blasting charges are dimensioned as well as possible on the basis of the known facts, the outcome of the blast does not, however, meet the planned design. Typically, when detached material is removed after the blast, it may be found that the remaining rock surface deviates significantly from the theoretical surface that should have been created after the blast. This may result from a plurality of different factors, such as fracturing properties or hardness of rock, or some other factor that cannot have been known in advance with a sufficient accuracy. As a consequence, however, the efficiency of excavation deteriorates and this, in turn, causes quite significant additional costs.

BRIEF DESCRIPTION OF THE INVENTION

The object of the present invention is to provide a method and an arrangement for producing drilling plans in which conditions are taken into account better than before, and consequently, a tunnel may be excavated more efficiently and more accurately than previously. The method of the invention is characterised by determining, in connection with hole drilling, the location of an end for at least some of the holes; storing the determined locations of hole ends in a memory; determining pull-out of a round on the basis of the locations of the determined hole ends and the topography of rock remaining after a round blast and designing or modifying the charging plan of a subsequent round on the basis of the thus determined pull-out.

The arrangement of the invention is characterised in that the arrangement comprises means for locating the location of the actual ends for at least some of the holes, means for storing the determined locations of the hole ends in a memory and means for determining the topography of the rock remaining after the round blast and whereby the pull-out of the blasted round can be defined on the basis of the defined end locations of the drill holes and the topography of the rock remaining after the blasted round and the charging plan may be designed or modified on the basis of the thus defined pull-out.

The idea of the invention is that in designing a charging plan for one or more subsequent rounds, the differences between the locations of drill hole ends of a last-blasted round and the locations of starting points of new holes to be drilled are taken into account. Further, the idea is that the charging plan is modified on the basis of these differences.

An advantage of the invention is that by taking into account the deviations from the plan appearing in the last-blasted round after the blasting, a more appropriate and more efficient charging plan for subsequent rounds is achieved, which will subsequently increase pull-out per round and thus improves the efficiency of the entire tunnelling process and reduces costs. Hence, changes in rock properties may be taken into account better than before in the operation as a whole.

BRIEF DESCRIPTION OF THE FIGURES

Some embodiments of the invention will be explained in greater detail in the attached drawings, in which FIG. 2 is a schematic view of a drilling plan, seen in the direction of a tunnel to be excavated, FIGS. 4a and 4b are schematic top views of an actual situation in a round after blasting.

In the figures, some embodiments of the invention are shown simplified for the sake of clarity. Like reference numerals refer to like parts in the figures.

DETAILED DESCRIPTION OF SOME EMBODIMENTS OF THE INVENTION

Figure 1:
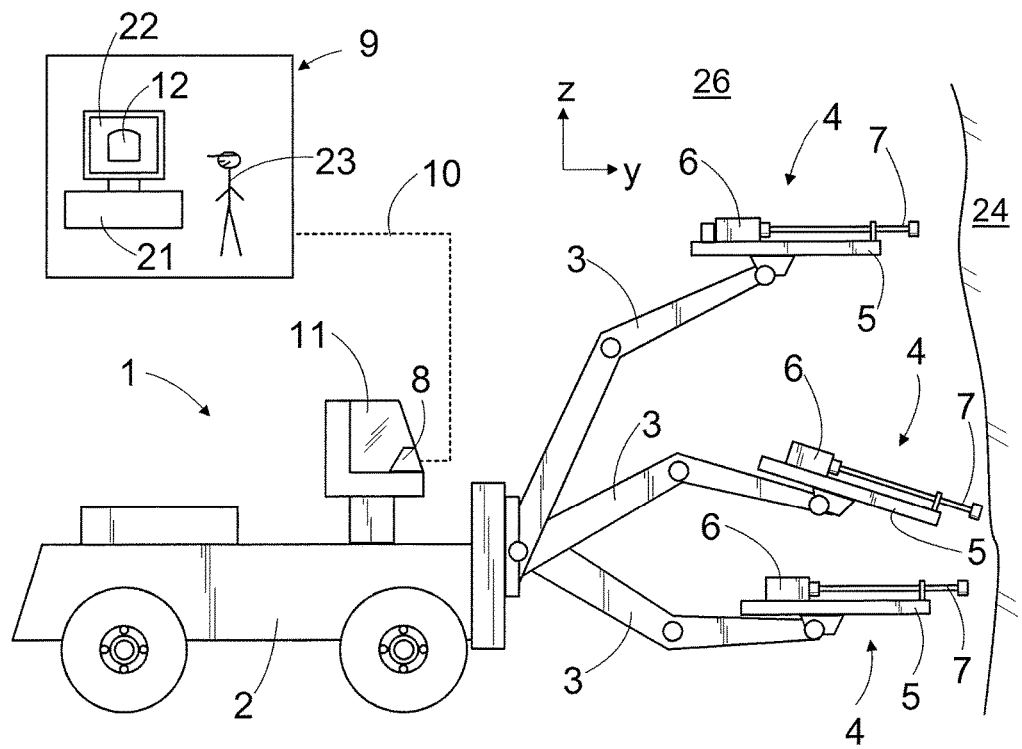
FIG. 1 is a schematic side view of a rock drilling apparatus and means, typically separate from the rock drilling apparatus, for designing a drilling plan.

FIG. 1 shows a rock drilling apparatus 1 that comprises a movable carrier 2, one or more drilling booms 3 and drilling units 4 arranged to the drilling booms 3. The drilling unit 4 comprises a feed beam 5, that allows a rock drilling machine 6 to be moved by means of a feed device. Further, the drilling unit 4 includes a tool 7, by which impact pulses delivered by a percussion device of the rock drilling machine are transmitted to the rock to be drilled. The rock drilling apparatus 1 further comprises at least one control unit 8 configured to control actuators included in the rock drilling apparatus 1. The control unit 8 may be a computer or a corresponding device, and it may comprise a user interface including a display device as well as control means for giving commands and information to the control unit 8.

Typically, a drilling plan and an excavation profile taking into account the charging plan are created for each round. In the drilling plan, the locations of the holes to be drilled are defined in a predetermined coordinate system. The locations of the holes to be drilled may be determined either as the starting points, directions and lengths thereof in said coordinate system, or merely as starting and ending points, on the basis of which their length and direction are correspondingly determined in the coordinate system. The charging plan, in turn, defines hole-specifically the explosive to be used, size of a charge, timings for blasting the charges, etc.

The drilling plan is normally designed at premises outside the drilling site, such as an office 9, with a design computer 21, on the display 22 of which the drilling plan 12 is shown when created or viewed, for instance. From the design computer 21 the drilling plan may be downloaded and stored in a memory means, such as a memory stick or diskette, or it may be transferred directly to a control unit 8 of the rock drilling apparatus over a data transmission connection 10 and stored in a memory means typically existing in the control unit, such as a hard disk or memory diskette. If necessary, the designing and modifying of the drilling plan 12 may also take place by means of the control unit 8 in a cabin 11 of the rock drilling apparatus 1, for instance. Further, the existing drilling plans may be modified either at the drilling site or outside it. The designing of the drilling plan is computed-aided and generally iterative in nature. A design program is executed on the design computer 21, the computer of the control unit 8 or the like, and the designer 23 operates interactively with the design program, entering necessary data, making selections as well as controlling the design process. The already designed parts of the plan may further be iteratively modified during the design process in order to achieve a better outcome. Correspondingly, on the basis of the hole locations determined in the drilling plan and the locations of their ends, a charging plan may be drawn up by a computer-aided design program for blasting a round. A person skilled in the art is familiar with the preparing of charging plans, and therefore it is not necessary to describe it in any greater detail.

The drilling plan being completed, it may be downloaded to the control unit 8 of the rock drilling apparatus and executed. The designed drill holes are drilled into the rock 24, charged and then blasted. A quantity of rock equal to that of a desired round is broken off the rock 24 and removed by transportation. New holes are then drilled for the next round, in accordance with the same or a new drilling plan 12.

FIG. 2 shows an example of the drilling plan 12, which may comprise a plurality of drill holes. In the drilling plan 12, the starting point 13a of a drill hole 13 may be represented by a suitable symbol, such as a circle, and the direction of the drill hole as a projection line 13b departing therefrom. An xz projection of the drilling plan 12, as shown in FIG. 2, may be displayed in a graphic user interface, i.e. display 22, of the design computer 21, or otherwise in the same manner as in the graphic user interface in the control unit 8 of the rock drilling apparatus 1.

Figure 3:
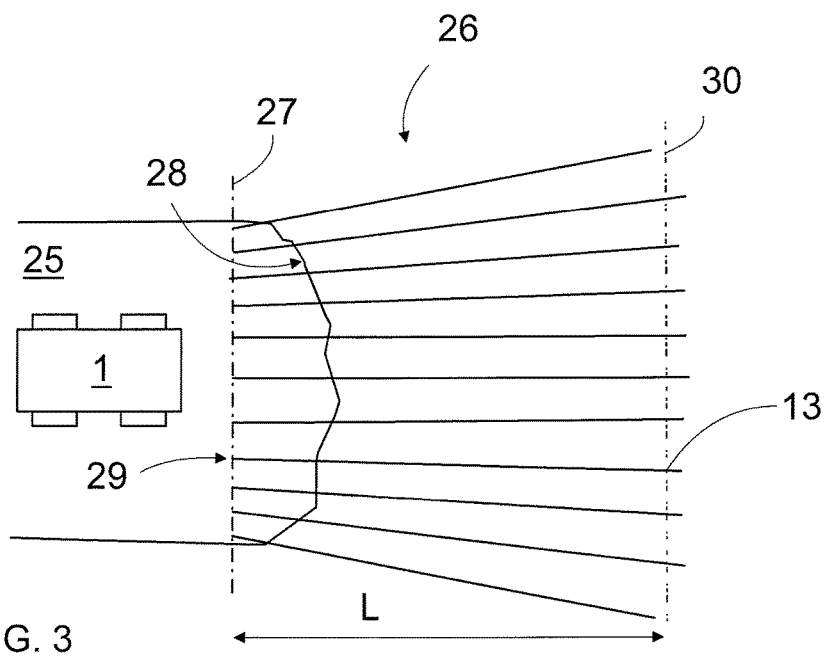
FIG. 3 is a schematic top view of a principle of a drilling plan.

FIG. 3 is a top view of the principle of a drilling plan 12 in connection with a round 26 to be drilled in a tunnel 25. In navigation, the coordinate systems of the drilling device and the drilling plan are linked to one another and to the coordinate system of the tunnel. After navigation, the drilling of the round may be carried out according to plan.

The figure shows how the holes 13 are located with respect to the rock to be drilled transversally to the tunnel at appropriate intervals and in different directions from the viewpoint of excavation. In general, the basis used for the drilling plan is a so-called navigation plane 27, which is an imaginary plane in the transversal direction of the tunnel at a distance from the actual rock surface 28. In the drilling plan, the theoretical starting points 29 of the holes to be drilled are determined in the coordinate system to be on the navigation plane, and the orientation of booms in the rock drilling apparatus is performed in such a manner that a drill rod passes through that point when the drilling starts.

The nominal length of the round 26 is the distance L between the navigation plane 27 and a theoretical ending plane 30. In reality, as appears in the figure, some of the holes extend beyond the ending plane and others, typically those in the edge parts, remain shorter than the length of the round.

FIGS. 4a and 4b are schematic top views of the actual situation normally prevailing in the round after blasting. In FIG. 4a, unbroken lines 33 depict the end parts of the drill holes in the blasted round which remained in the rock after blasting and around which the rock did not detach in the blasting. Further, broken lines 34 depict the holes to be drilled for a next round. The area between the remaining rock surface, i.e. starting surface 28, and the theoretical ending surface 36 passing through the hole ends of the round is rock that, in theory, should have been detached in the blast. This rock is illustrated in FIG. 4b by area 37. In practice, such rock always remains, and when the quantity thereof is subtracted from the designed rock quantity intended to detach in the blast, there will be obtained the earlier mentioned pull-out, i.e. the detached rock quantity as a percentage of the intended quantity. The thickness of the remaining rock may vary greatly in various parts of the transversal surface of the tunnel, depending, inter alia, on the rock type and structure, how well the drilling of holes succeeded, etc.

FIGS. 5a to 5d, in turn, are schematic perspective views of the mutual relation between two actually realized rounds in the same tunnel excavation, and the remaining rock, not detached in connection with the blast, between the designed round and the realized round. The shape of said non-detached rock is obtained, for instance, by determining the locations of the starting points of holes to be drilled in a next round on the surface of the remaining rock and the locations of hole ends of the preceding round and by forming on the basis of these points a body that shows to the user the volume of rock not detached in the round blast.

Figure 5A:
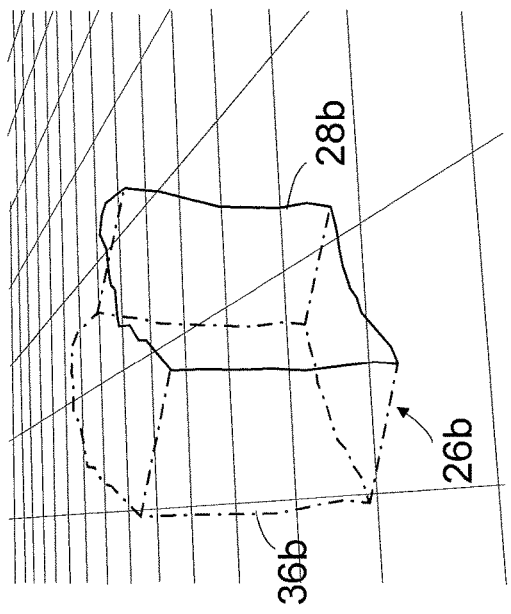
FIGS. 5a to 5d are schematic perspective views of situations in two consecutive rounds.
Figure 5B:
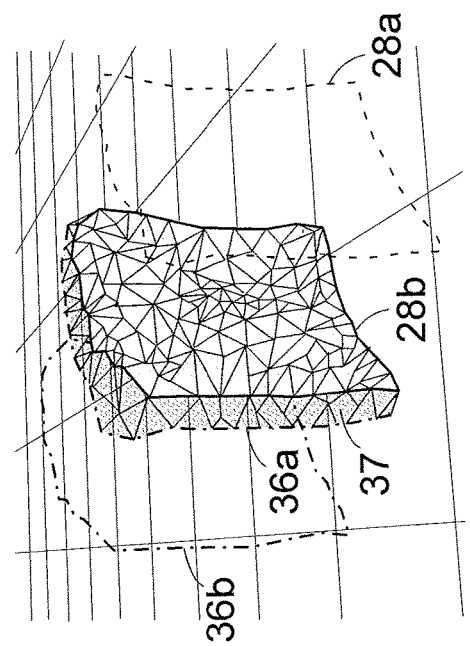

FIG. 5a shows the shape of one round 26a in the coordinate system of the tunnel on the basis of the starting points of its drilled holes on the starting surface 28a of the rock and the ending surface 36a defined by the locations of the hole ends and passing therethrough. FIG. 5b, in turn, shows the shape of a next round 26b in the same coordinate system correspondingly on the basis of the starting points of new drill holes on the starting surface 28b of the rock remaining from the blast of the preceding round 26a and the ending surface 36b defined by the locations of its hole ends and passing therethrough.

Figure 5C:
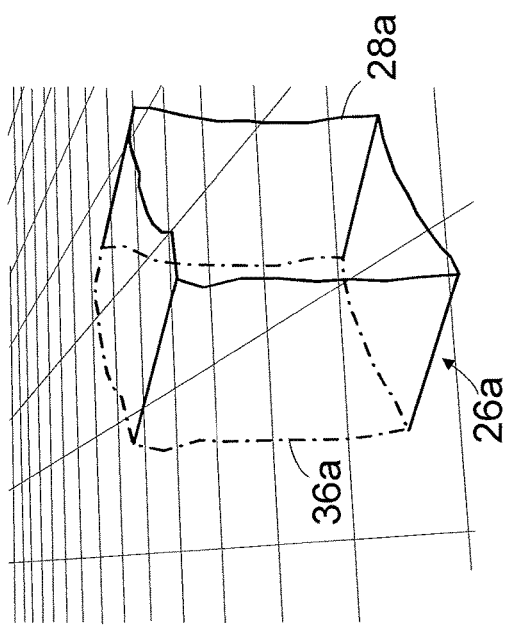
Figure 5D:
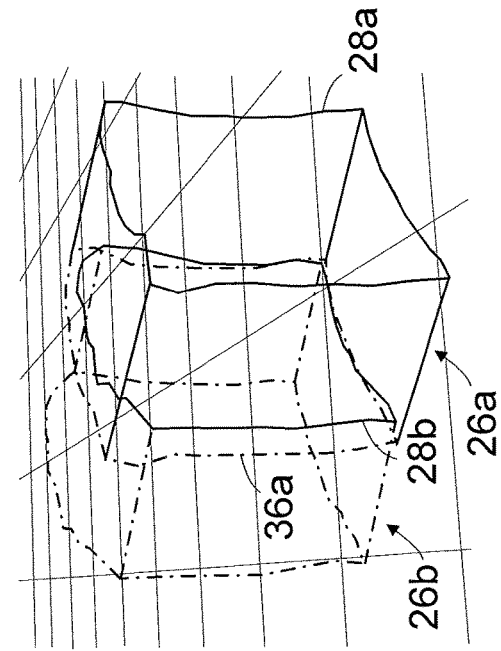

In FIG. 5c, the rounds 26a and 26b are placed in their actual mutual position, and consequently it appears that the starting surface 28b of the latter round 26b is closer to the starting surface 28a of the preceding round 26a than the theoretical ending surface 36a of the round 26a. Hence, between the surfaces 28b and 36a there remains rock 37 that, in theory, should have been detached in the blast. This rock 37 is illustrated in FIG. 5d. This means a loss in the achieved round length, because all the desired rock did not detach. This also means slower advance in the tunneling work as well as additional costs. These features are to be substantially improved by means of this invention.

The idea of this invention is to amend the charging plan for subsequent rounds in such a manner that on the basis of the blast outcome of an implemented round the charging plan to be used in the drilling of one or more subsequent rounds will be modified and optimized.

In current practice, the drill holes are drilled according to the designed plans, irrespective of the location where the actual starting point of the hole is. So, because of the extra rock the actual starting point of the hole deviates from the theoretical starting point without it having any effect on the design and implementation of the drilling plan or the charging plan. According to this invention, the charging plan is corrected, when necessary, on the basis of the realized outcome. So, for instance, charging, such as charge sizes, quality of explosives etc., may be modified already in connection with a next round, in order that the blast outcome would better correspond to what is desired.

The basis for the modification of the charging plan consists of the surface topography of rock determined at the start of hole drilling for a new round and the locations of the drill hole ends in the rock of the blasted round. The surface topography of rock, i.e. its profile is obtained by measuring it accurately with a measuring device, such as a laser or ultrasound measuring device. Alternatively, it may be determined approximately, with a sufficient precision, by determining the starting points of the drill holes for the next round on the surface of the rock. The determination may be performed either by measuring them with a separate measuring device known per se or by determining the location data by means of the control unit of the rock drilling apparatus. The location data of the starting points of the holes may be measured either before, during or after drilling. Correspondingly, the location data of the drill hole ends are provided either by measuring them with a separate measuring device or by determining them by means of the control unit of the rock drilling apparatus. According to desired accuracy, it is possible to determine the location data of the starting and ending points of all holes or just the location data of suitably selected holes.

By means of the thus determined surface topography of the rock and the location data of the determined hole ends it is possible to calculate the pull-out of a preceding round and, if so needed, to amend the charging plan for a next round or any subsequent round in the above-described manner.

When the control unit of the rock drilling apparatus is used, the determination is implemented, in practice, in such a way that when the operator, such as driller, starts drilling a hole, he moves the boom of the rock drilling apparatus to a correct drilling position with respect to the hole to be drilled, whereby the device sensors can measure the starting point of hole in the drilling direction. This information is stored in the control unit of the drilling apparatus, and on the basis of this information and the actual location data of a corresponding, earlier drilled hole is calculated the difference between these points. When this procedure is carried out for all holes or the selected holes in the drilling plan, it is also possible to calculate how much rock, and the amount of rock at each particular point of the transversal surface of the tunnel that remains undetached as compared to the drilling plan.

This principle, either by means of the computer on the drilling apparatus or by transmitting data the to a computer outside the rock drilling apparatus for use by a charging plan designer not on site, allows the necessary modifications to be determined in the charging plan for a next round, so that in the next round blast rock material could be broken and detached from the rock in better compliance with the plan. The charging plan having been defined on the basis of said differential data, it is immediately available to the control computer of the rock drilling apparatus, or it is transmitted to the control computer of the rock drilling apparatus for use.

A change in the charging plan may be implemented immediately in connection with the drilling of a round following the blast of a previous round, yet, in practice, it is also useful when employed for correcting the charging plan of a round subsequent to the next round. In practice, measuring, separate from the drilling device, could be performed by a laser scanner, which stores the surface profile throughout the entire surface and does not concentrate in any way on the starting points of the holes to be drilled. Laser scanning as such is an operation taking only minutes, and therefore it does not slow down the work in any way whatsoever.

In some cases, features disclosed in this application may be used as such, regardless of other features. On the other hand, when necessary, features disclosed in this application may be combined in order to provide various combinations.

The drawings and the related description are only intended to illustrate the idea of the invention. Details of the invention may vary within the scope of the claims.

The invention claimed is:

1. A method for designing a charging plan for excavating a rock cavern, the method comprising the steps of:
  determining in advance at least drill hole locations and the location of their ends in a pre-determined set of coordinates for a round to be drilled into the rock cavern;
  preparing a charging plan for the holes in the round by means of a computer-aided design program for blasting the round;
  determining, in connection with the drilling of the holes, the actual location of hole ends for at least some of the holes;
  storing the determined actual locations of hole ends in a memory;

determining pull-out of a round on the basis of the determined actual locations of the hole ends and topography of rock remaining after a round blast; and designing or modifying the charging plan of a subsequent round on the basis of the thus determined pull-out.

2. A method as claimed in claim 1, wherein the topography of the rock is determined by measuring the profile of the remaining rock with a measuring device.

3. A method as claimed in claim 1, wherein the topography of the rock is determined by measuring at least some of the starting points of the drill holes for a next round on the surface of the rock and by calculating an approximate value of the surface profile on the basis thereof.

4. A method as claimed in claim 3, wherein the locations of the starting points of the holes to be drilled are determined by measuring by means of a control system of a rock drilling apparatus.

5. A method as claimed in claim 4, wherein the locations of the end points of the holes to be drilled are determined by measuring with the control system of the rock drilling apparatus.

6. A method as claimed in claim 3, wherein the locations of the starting points of the holes to be drilled are determined by measuring with a separate measuring device.

7. A method as claimed in claim 1, wherein the locations of the end points of the holes to be drilled are determined by measuring them with a separate measuring device after the drilling of the hole.

8. A method as claimed in claim 1, wherein the charging plan for a round is prepared by a computer belonging to the control unit of the rock drilling apparatus.

9. A method as claimed in claim 1, further comprising the steps of:

transferring the measured location data on the drill hole ends from the rock drilling apparatus to an external computer separate from the rock drilling apparatus;

calculating the realized pull-out and designing or modifying the charging plan for a subsequent round by said external computer separate from the rock drilling apparatus; and transmitting the obtained charging plan to the control computer of the rock drilling apparatus.

10. A method as claimed in claim 1, further comprising preparing the charging plan by modifying on the basis of pull-out the charging plan already prepared in advance.

11. A method as claimed in claim 1, further comprising preparing the charging plan on the basis of pull-out for a round following the last-blasted round.

12. A method as claimed in claim 1, further comprising preparing the charging plan on the basis of pull-out for a round subsequent to the round following the last-blasted round.

13. A method as claimed in claim 1, further comprising determining drill hole locations in a predetermined coordinate system as starting points, direction angles and drill hole lengths of the holes to be drilled.

14. A method as claimed in claim 1, further comprising determining drill hole positions in the predetermined coordinate system as starting points and end points of the holes to be drilled.

15. A method as claimed in claim 14, further comprising determining the position of the starting points of the drill holes, and correspondingly, that of the end points of the drill holes in the predetermined coordinate system for all holes to be drilled.

16. An arrangement for designing a charging plan for excavating a rock cavern with a rock drilling apparatus comprising one or more drilling booms having a rock drilling unit attached to it and a control unit for controlling the drilling comprising a computer, whereby at least locations of drill holes in a predetermined coordinate system has been defined in advance for a round to be drilled the arrangement comprising:

a computer with the computer assisted design program for designing the charging plan;

means for locating the location of the actual ends for at least some of the holes;

means for storing the determined locations of the hole ends in a memory; and means for determining the topography of the rock remaining after the round blast, wherein the pull-out of the blasted round can be defined on the basis of the defined end locations of the drill holes and the topography of the rock remaining after the blasted round and the charging plan may be designed or modified on the basis of the thus defined pull-out.

17. An arrangement according to claim 16, wherein the means for defining the topography of rock remaining after a round blast include a measuring device for measuring the profile of remaining rock.

18. An arrangement according to claim 16, wherein the means for defining the topography of rock remaining after a round blast comprise a measuring device for measuring the starting point of at least part of the drill holes for the next round on the surface of the rock and for calculating the approximate of the rock surface profile on the basis of the measured starting points.

19. An arrangement according to claim 18, wherein the measuring means for measuring the starting points of the holes to be drilled are part of the control system for the rock drilling apparatus.

20. An arrangement according to claim 18, wherein the measuring means for measuring the starting points of the holes to be drilled include a separate measuring device.

* * * * *